United States Patent [19]
Dobuzinsky et al.

[11] Patent Number: 5,412,246
[45] Date of Patent: May 2, 1995

[54] LOW TEMPERATURE PLASMA OXIDATION PROCESS

[75] Inventors: David M. Dobuzinsky; David L. Harmon, both of Essex Junction, Vt.; Srinandan R. Kasi, Croton-On-Hudson, N.Y.; Donald M. Kenney, Shelburne, Vt.; Son V. Nguyen, Williston, Vt.; Tue Nguyen, Essex Junction, Vt.; Pai-Hung Pan, Hopewell Junction, N.Y.

[73] Assignee: International Business Machines Corporation, Armonk, N.Y.

[21] Appl. No.: 186,568

[22] Filed: Jan. 26, 1994

Related U.S. Application Data

[60] Division of Ser. No. 915,752, Jul. 21, 1992, Pat. No. 5,330,935, which is a continuation of Ser. No. 602,993, Oct. 24, 1990, abandoned.

[51] Int. Cl.⁶ ............................................. H01L 29/12
[52] U.S. Cl. .................................... 257/632; 257/640; 257/900
[58] Field of Search ..................... 257/900, 301, 408

[56] References Cited

U.S. PATENT DOCUMENTS

| | | | |
|---|---|---|---|
| 4,268,711 | 5/1981 | Gurev | 136/256 |
| 4,341,592 | 7/1982 | Shortes et al. | 156/643 |
| 4,414,040 | 11/1983 | Kvaas | 148/6.3 |
| 4,649,625 | 3/1987 | Lu | 257/301 |
| 4,786,609 | 11/1988 | Chen | 257/900 |
| 4,871,416 | 10/1989 | Fukuda | 156/635 |
| 4,872,947 | 10/1989 | Wang et al. | 156/643 |
| 4,900,695 | 2/1990 | Takahashi et al. | 437/195 |
| 4,916,091 | 4/1990 | Freeman et al. | 437/238 |

FOREIGN PATENT DOCUMENTS

| | | |
|---|---|---|
| 219126 | 6/1958 | Australia . |
| 81916 | 7/1970 | German Dem. Rep. . |
| 59-75629 | 4/1984 | Japan . |
| 1235285 | 9/1989 | Japan . |

*Primary Examiner*—Robert P. Limanek
*Attorney, Agent, or Firm*—Sughrue, Mion, Zinn, Macpeak & Seas

[57] ABSTRACT

A process for forming a thin film on a surface of a semiconductor device. The process involves formation of a silicon dioxide film by plasma enhanced thermal oxidation, employing a mixture of ozone and oxygen which are generated separately from the reactor chamber in a volume ratio of about 1–10/1, preferably about 5–7/1, at a temperature generally below 440° C., preferably about 350°–400° C. The process is used to form sidewall oxide spacers on polysilicon gates for field effect transistors. A relatively fast oxidation rate is achieved at a temperature significantly below that employed in conventional oxidation processes, and this serves to reduce dopant diffusion from the polysilicon. In addition, the resulting film demonstrates low stress with good conformal step coverage of the polysilicon gates. Another use of the process is to grow thin gate oxides and oxide-nitride-oxide with a thickness of less than 100 Å. An oxide film of uniform thickness is formed by controlling the temperature, RF power, exposure time and oxygen/ozone ratio for thin gate oxide (<100Å) application in ULSI FET fabrication.

8 Claims, 2 Drawing Sheets

LOW TEMPERATURE PLASMA OXIDATION PROCESS

This is a divisional of application Ser. No. 07/915,752, filed Jul. 21, 1992, now U.S. Pat. No. 5,330,935, which is a continuation of application Ser. No. 07/602,993, filed Oct. 24, 1990, now abandoned.

This invention is related to a process for the oxidation of a conductive or semiconductive surface and the resulting structures. In particular, this invention is concerned with the oxidation of a substrate or intermediate structure which is used in the fabrication of integrated circuits by employing plasma oxidation with a mixture of ozone and oxygen at relatively low temperatures.

BACKGROUND OF THE INVENTION

Oxidation of substrates used in semiconductive elements has in the past been performed utilizing a variety of techniques to create insulating layers. Thin silicon dioxide films so formed have a wide range of application in the semiconductor industry. They have been formed by thermal oxidation of silicon, plasma enhanced chemical vapor deposition, known as glow discharge deposition, plasma anodization and plasma oxidation. Each of these processes has various advantages and disadvantages. For example, when thin silicon dioxide is formed by techniques of thermal oxidation higher quality films are obtained, especially the film properties at the silicon-oxide interface. However, high temperatures are required, typically in excess of 900° C. which are too high for contemporary applications.

As the technology advances beyond VLSI and into ULSI devices of ultrahigh density, such as 64M bit and 256M bit DRAMS, low temperature processing is required to minimize unwanted dopant diffusion and lower film stress.

Thus, within semiconductor processing technology a variety of techniques have been proposed to achieve oxidation at temperatures below 700° C. and in some cases even below 300° C.

Reference is made to U.S. Pat. No. 4,323,589 which is directed to a process of growing oxide film on a silicon substrate utilizing plasma oxidation. In the '589 patent the process employs oxygen at a flow rate of 0.7–10 sccmm utilizing a relatively high r.f. power (1000–7000W). It is well known that the use of high RF power, generally in excess of 200W, results in thicker oxide films. However, the films are generally of poor quality for ULSI applications. The '589 patent employs oxidation over a processing time ranging from 15 minutes to 8 hours with a high oxide growth rate achieving thicknesses of approximately 2600A. In accordance with the process in the '589 patent, oxidation occurs on the side of the wafer facing away from the plasma.

Reference is made to U.S. Pat. No. 4,576,829 also directed at a low temperature oxidation process. In the '829 patent plasma oxidation is carried out in a magnetically enhanced glow discharge system. The temperature of the silicon substrate is maintained at a temperature below 300° C. during oxidation.

Techniques to enhance oxidation by the use of ozone are also established for a variety of different applications. It is, for example, well established that the use of ozone as a cleaning technique to expedite the removal of carbon deposits on surfaces allows the process to be carried out at relatively low temperatures. U.S. Pat. No. 2,443,373 is representative of a myriad of art which is directed at the use of ozone for purposes of cleaning surfaces. The cleaning of semiconductor wafers utilizing hydrochloric acid bubbled with vapor containing ozone is disclosed in JP58-100433.

Given the established qualities of ozone as a constituent for use in wafer cleaning, it has further been proposed to use an ozone enriched atmosphere for purposes of enhancing the formation of films on semiconductor devices. 68JP-092936 discloses the formation of an insulating film on a semiconductor by growing silicon dioxide utilizing the reaction of gaseous phase monosilane and ozone. 1973 JP-008434 describes the deposition of silicon dioxide films on a substrate by admitting ozone in a decomposable silicon CVD gas source into a reactor containing the substrate. The substrate is then irradiated using UV to allow low temperature operation.

While UV radiation will enhance the oxidation rate of a silicon substrate in an ozone environment, there are disadvantages associated with this technique. For example, at a medium UV light intensity the rate enhancement would be significantly lower than those of plasma enhancement due to much lower steady state reactive oxidation species in the oxidation ambient. As a result, the oxidation rate will be much lower. As the UV light intensity increases, the substrate will tend to heat up significantly thus losing the advantages of low temperature processing.

Moreover, high UV light radiation causes significant trapped electron/hole pairs in the silicon dioxide layer. This makes it unsuitable for not only ULSI but also VLSI fabrication without a subsequent high temperature annealing step. A more general problem with the use of UV radiation in the formation of semiconductor devices is that it is difficult to achieve a coherent and uniform UV light source beam in the range of 5–8 inches in diameter. Consequently, the oxidized layer thickness uniformity tends to be poor when compared with those produced with plasma oxidation.

The chemical deposition of an oxide film at very low temperatures with ozone in combination with monosilane is disclosed in 82JP-186956. In this technique oxygen is passed through an ionizer prior to passage into the reaction chamber. The technique allows the formation of an oxide film on a surface of a substrate which is decomposed at about 200° C., for example, a synthetic resin.

East German Patent 81,916 discloses a process of oxidizing silicon surfaces by employing a mixture of oxygen and ozone. However, the ozone generation takes place in the r.f. reactor tube itself through an r.f. electrical discharge. This process is basically identical to those of U.S. Pat. No. 4,323,589 where ozone is also generated in the oxygen r.f. glow discharge. As a result high r.f. power, far exceeding 200W, is needed to sustain sufficient reactive ozone in the discharge for any oxidation below 400° C. Consequently, the oxide film grown by this kind of discharge will have inferior quality and be unsuitable for ULSI fabrication. In the '916 disclosure, the silicon surface is heated to a temperature of approximately 100° C. As in other techniques, the oxidizing effect of ozone is also enhanced by U.V. radiation.

Another example of forming insulating films utilizing oxygen and ozone is disclosed in U.K. patent specification 1,274,699. In accordance with the '699 disclosure, a silicon dioxide film is grown by gaseous phase reaction of monosilane and ozone with a reaction temperature in the range of 150°–300° C.

The use of plasma deposition for semiconductor processing has been proposed but has achieved limited commercial success. This is because of the difficulty in controlling plasma processing parameters and the complexity of the phenomena involved. For early steps of ULSI fabrication, the film's quality has been considered too low to compete with other methods. Similarly, plasma oxidation processing has also remained an object of study but has not achieved commercial utility.

The primary role of plasma in the production of semiconductor devices is to produce chemically active specie that subsequently are deposited on or oxidize the surface under processing. In general, the plasma used for semiconductor applications is produced by the application of a high frequency electric field across a body of gas. When the plasma process commences energy from the electric field is coupled into the gas almost entirely via the kinetic energy of a few free electrons. The electrons acquire energy from the field and lose it rather slowly as a consequence of elastic collisions. Those electrons become capable of inelastic collision and ionize, or dissociate gas molecules to produce secondary electrons by electron impact reactions. A key factor is that the substitution of electron kinetic energy for thermal energy avoids excessive heating and consequent degradation of substrates. Thus, plasma processing is attractive in that it can be operated at lower temperatures. Recent reviews of various known plasma techniques for the oxidation and deposition of materials on silicon is presented in "Plasma Assisted Chemical Vapor Deposited Thin Films for Microelectronic Applications", S. V. Nguyen, J. Vac. Sci. Technol. B. 4.(5), sep/oct 1986, 1159–1167 and "Handbook of Thin-Film Deposition Processes and Techniques" edited by Klaus K. Schuegraf, Noyes publication pp. 112–146 and pp. 395–408, published in 1988. Reference is also made to other reports in the literature directed at the use of plasma in the deposition of silicon oxide films by the use of a remote plasma enhanced chemical vapor deposition (RPECVD), PPD Richard, et al, "Remote Plasma Enhanced CVD Deposition of Silicon Nitride and Oxide for Gate Insulators in (Rn,Va) As FET devices", J. Vac. Sci. Technol. A.(3), May/Jun 1985, 867–872; Lucovsky, et al "Deposition of Silicon Dioxide and Silicon Nitride by Remote Plasma Enhanced Chemical Vapor Deposition", J. Vac. Sci. Technol. A 4(3), May/June 1986, pp. 681–688; and Tsu, et al, "Silicon Nitride and Silicon Dimide Grown by Remote Plasma Enhanced Chemical Vapor Deposition", J. Vac. Sci. Technol. A 4(3), May/Jun 1986, pp. 480–485.

The ability to reduce processing temperatures in the creation of oxides is important since it minimizes dopant diffusion and also reduces stress in the film. These two factors potentially allow the formation of thinner oxides. Although plasma deposition has been used to deposit oxide films suitable as interlevel metal dielectric for ULSI devices, however, to date both plasma oxidation and deposition, despite the theoretical advantages, have not been demonstrated to be practically effective for high quality thin gate oxide, node dielectric or sidewall spacer fabrication for ULSI devices.

SUMMARY OF THE INVENTION

Given the deficiencies in the prior art it is an object of this invention to provide for an improved process of growing high quality thin gate oxide on single crystal silicon.

Yet another object of this invention is to peroxide for a process to grow very thin gate oxides and/or codeposited Oxide/Nitride/Oxide with good breakdown voltage for use in ULSI devices.

A further object of this invention is to provide a method of growing thin gate oxides on single crystal silicon substrates taking advantage of the cleaning power of ozone.

A further object of this invention is to provide for formation of very thin sidewall spacers utilizing low temperature processing.

A further object of this invention is to provide a thin gate oxide having a width (thickness) of less than 100Å grown at low temperature utilizing ozone plasma processing.

These and other objects of this invention are accomplished by the use of a processing system which utilizes a mixture of oxygen and ozone generated from an ozone generator, separate from the r.f. plasma oxidation reactor. This separation of ozone generator from the r.f. is critical because it eliminates the need for high r.f. power (in the oxidation reactor) that will result in poor uniformity and inferior thin oxide films. The amount of ozone/oxygen is adjusted through the generator. A wafer is placed in a processing chamber and the temperature of either the chamber or the wafer is adjusted. RF power may be used but is optional. The use of lower r.f. power ($<200w \sim 1w/cm^2$) is desired to enhance oxide growth rate and to improve film quality and thickness uniformity. The use of r.f. power is also to re-excite or redistribute the ozone. During processing, ozone initially removes any organic contaminants on the wafer. Thus, after the wafer is loaded into the processing chamber the chamber is pumped down to a low pressure to remove contaminants. If UV processing is used the lamp is turned on for enhanced cleaning. The temperature is then raised to the desired level for low temperature processing and the oxygen/ozone mixture flows into the chamber for the desired processing time. If RF power is used in case of low temperature oxidation, it is turned on during this period of processing.

Once plasma processing has been completed rapid thermal processing may also be used as a follow-on step. Flow rates are adjusted and the temperature is raised, but is maintained below 700°–800° C. The wafer is then processed utilizing rapid thermal oxidation techniques in the presence of ozone but at a materially lower temperature than previously used. By the use of ozone processing, supplanted when necessary with rapid thermal processing, very thin structures such as spacers and gate oxides are formed by this invention.

This invention will be described in greater detail by referring to the attached drawing and the description of the preferred embodiments which follow.

DESCRIPTION OF THE PREFERRED EMBODIMENT

This invention is directed at achieving smaller semiconductor devices. As device sizes reduce, a standing requirement is the formation of high quality thin dielectrics such as spacers, and oxide or oxide/nitride/oxide dielectrics for use in device processing. ULSI integrated circuit DRAM technology featuring devices having in the order of 256M bits or greater, must have gate oxides less than 70Å thick with good, predictable breakdown voltages. Prior techniques do not permit the controlled growth of such thin gate oxides in conventional furnaces by annealing due to initial rapid growth rate. Moreover, as set forth in the background of this invention the cleaning procedure of a silicon wafer prior to oxidation may materially affect the kinetics and quality of the subsequent growth of the oxide.

This invention utilizes ozone and UV/ozone not only for the cleaning of silicon wafers but also for the purpose of growing gate oxides. In cleaning at room temperatures it is known that ozone leaves a very thin oxide in the range of 10Å. Such an oxide is, however, self limiting and is used primarily for purposes of passivation of a silicon wafer. In some situations this film needs to be stripped off and thin sidewall oxide spacers are grown on either n or p doped polysilicon films.

Figure 1:
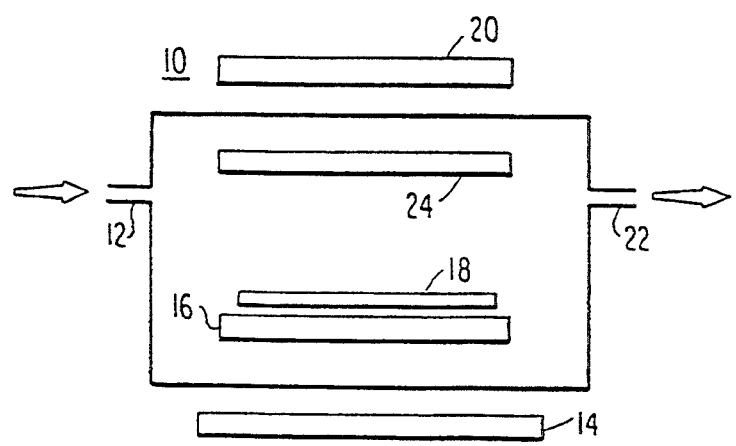
FIG. 1 is a schematic figure of the processing chamber used in accordance with this invention in which the ozone/oxygen generator is separate from the processing oxide chamber.

Referring now to FIG. 1 the processing equipment for this invention is disclosed. This may include an AME 5000 single wafer system. The gas inlet 12 of the chamber 10 receives a mixture of oxygen and ozone from an ozone generator, separate from the processing chamber. The amount of ozone in the mixture is adjusted at the ozone generator. A heating element 14 is used to raise the temperature of the processing chamber. Alternatively, the susceptor 16 can be heated such that the wafer 18 is itself directly temperature controlled. The heating element 14 can be one which is conventionally used in a furnace for low temperature processing or for the performance of rapid thermal oxidation. An RF powered electrode 20 may be included. When used it tends to re-excite and redistribute the ozone. This will enhance the oxide growth rate especially at low temperatures (below 400° C.). The presence of ozone initially tends to remove organic contaminants during the initial stage in the oxide growth process. As mentioned, growth in the presence of ozone is self limiting. A UV lamp can be used for purposes of additional cleaning enhancement of a silicon wafer prior to oxidation. It may also be used to clean the wafer during oxidation.

In operation, after the wafer 18 is loaded into the processing chamber, the chamber is pumped down to a low pressure to remove contaminants. Such is done by closing the inlet and coupling the exhaust 22 to a vacuum source, not illustrated. The UV lamp 24 is then turned on for enhanced cleaning. The temperature is raised to the desired level for low temperature processing utilizing the heater 14. The oxygen/ozone mixture is allowed to flow into the chamber through inlet 12 for the desired processing time. RF power can be turned on during this time to re-excite and distribute the ozone in the chamber.

Figure 2:
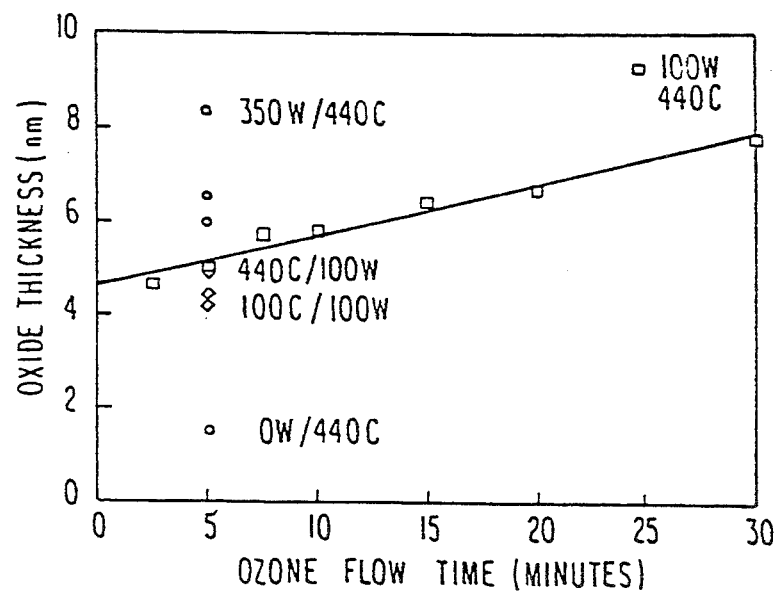
FIG. 2 is a graph showing oxide thickness as a function of ozone flow time.
Figure 3:
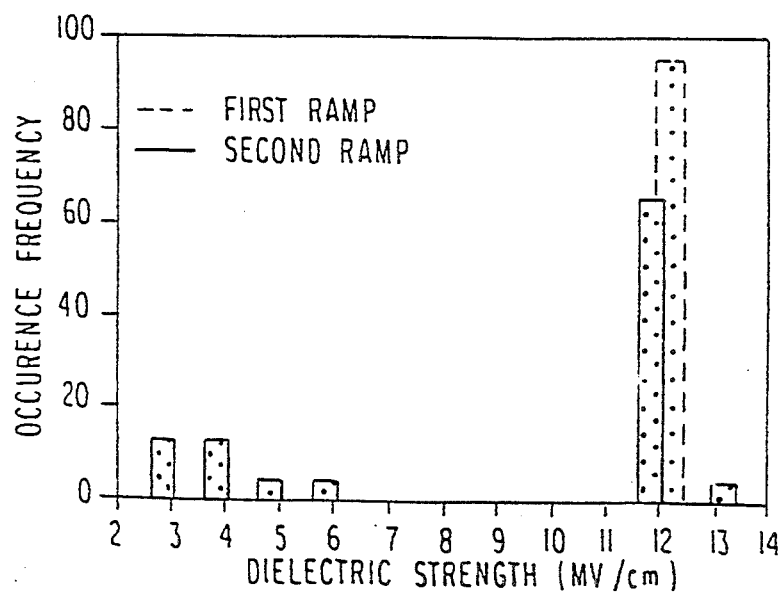
FIG. 3 is a graph illustrating the breakdown field of a 55Å thick oxide sample grown in accordance with this invention.

Referring now to FIG. 2 and FIG. 3 the results of oxide growth in accordance with this invention are reported. In FIG. 2 an oxide of 55Å was grown and controlled as a function of temperature, RF power, the exposed time and the oxygen/ozone mixture. Such is illustrated in FIG. 2. The oxide has a uniform thickness of about 3–10%(3σ) across the wafer. This fluctuation results from using a tool that does not have a shower head to distribute the oxygen/ozone gas mixture uniformly onto the substrate. It will be apparent to those of working skill that by the use of a shower head a more uniform distribution will result. As illustrated in FIG. 3 the breakdown field is about 12MV/cm. The breakdown distribution illustrated in this figure is very good. The breakdown voltage is defined as the voltage where the current reaches 1μA. The voltage was ramped twice as illustrated by solid and dashed lines. The high breakdown field of the second ramp illustrated by the solid line indicates that the actual breakdown field is higher.

Figure 4A:
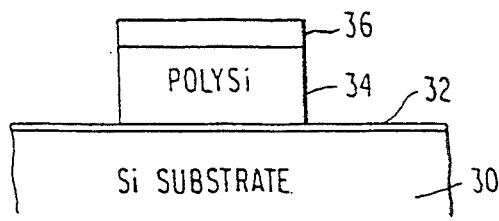
FIG. 4A illustrates the first step in the growth of thin sidewall spacers in accordance with this invention.
Figure 4B:
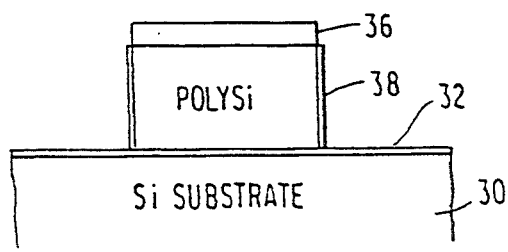
FIG. 4B illustrates the second step in the formation of oxide spacers utilizing plasma oxidation processing in accordance with this invention.

Referring now to FIGS. 4A and 4B detailed processing steps are illustrated. It will be appreciated by those of working skill that FIGS. 4A and 4B define intermediate steps of spacer formation in semiconductor device processing.

A silicon substrate 30 has formed thereon a gate oxide 32. A submicron polysilicon layer 34 has a dielectric mask 36 deposited thereon. The dielectric mask 36 may be either a nitride or oxide layer. The polysilicon 34 may be either n or p doped. FIG. 4A illustrates a conventional structure prior to processing using the technology of this invention.

In accordance with this invention utilizing the processing conditions illustrated in FIGS. 1, 2 and 3 plasma oxidation for the formation of sidewall spacer 38 and oxide/nitride/oxide (ONO) dielectric capacitors are fabricated. The typical conditions for growing thin oxide with ozone plasma oxidation are:

gases—$O_3$ (100–3000 sccm) $O_2$ (50–500 sccm)
RF power—100–600 watts
pressure—5–10 torr
tool set—AME 5000
thickness—30–300Å (in 1–5 minutes oxidation)
Temperature—200°–440° C. (preferably 350°–400° C.).

Figure 5A:
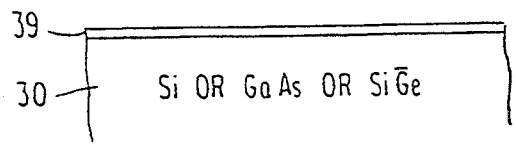
FIG. 5A illustrates the first step in the oxide/nitride/oxide composited capacitors dielectric in accordance with this invention.
Figure 5B:
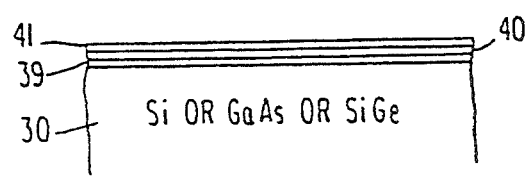
FIG. 5B illustrates the deposition of silicon nitride by CVD processing, and then reoxidation of this nitride layer by ozone plasma oxidation to form Oxide, Nitride/Oxide capacitors.

FIG. 5A and 5B define the steps for oxide/nitride/oxide (ONO) dielectric capacitor formation on a planar surface and over a deep trench structure. The substrate may be Si, GaAs or SiGe. An oxide layer 39 is grown by ozone oxidation in accordance with this invention.

For a ONO capacitor, after the thin oxide layer 39 is formed additional CVD depositions of silicon nitride 40 and the same reoxidation step in ozone plasma to form oxide 41 are needed. Using these techniques low temperature processing occurs which reduces dopant intrafusion and minimizes film stress. As illustrated in FIG. 5B a thin silicon nitride layer 40 is deposited by CVD processing. Oxide layer 41 is grown by ozone reoxidation of the silicon nitride layer 40.

Figure 6:
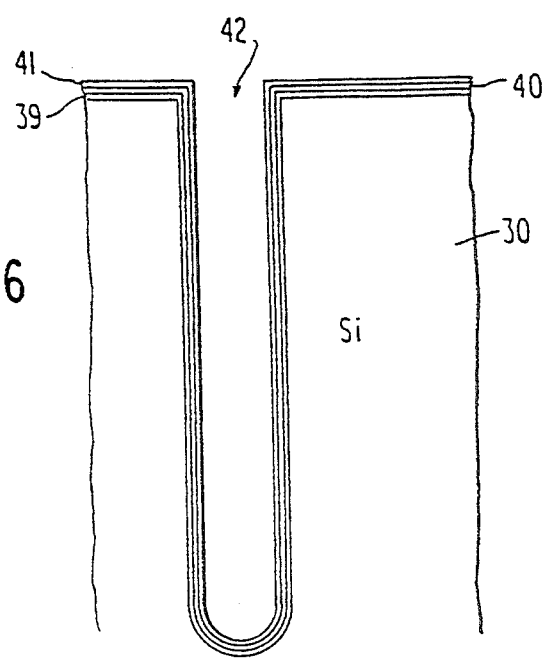
FIG. 6 illustrates the same process steps as 5A and 5B over a deep trench structure used for charge storage and isolation applications in ULSI fabrication.

In FIG. 6 the same steps of FIGS. 5A and 5B are formed over a predefined deep trench structure. The formation of the trench by masking and etching is well known in the art. Following trench formation in the substrate 30, processing according to this invention commences. FIG. 6 illustrates a structure for charge storage or isolation.

Actual samples demonstrate high conformal sidewall coverage for sidewall spacer independent of polysilicon sidewall etch profiles. Importantly, ozone plasma offers faster oxidation rates and better uniformity. This permits a more stable and controllable film thickness under ozone plasma oxidation conditions, especially for thin films less than 50Å. For an ONO capacitor, the ozone plasma oxidation also reduces processing temperature significantly from typically 950°–1000° C. as in the prior art.

While used on silicon substrates, this invention is usable on SiGex alloys, GaAs, and other materials.

Also, this invention is combinable with rapid thermal oxidation to achieve even shorter processing times. Typically, thermal oxidation is performed in either a dry or wet oxygen ambient conditions with sufficiently high temperatures in the range of 1000° C. over relatively long times of 10–100 minutes. Rapid thermal oxidation sufficiently shortens the processing time to less than a minute, however, high temperature requirements still exist.

Utilizing ozone technology thicker oxides can be grown at low temperatures by combining this technology with rapid thermal oxidation. In particular, the oxidation gas is replaced by a mixture of oxygen/ozone to reduce the oxidation temperature and also to incorporate self cleaning during rapid thermal oxidation. After the initial plasma ozone oxidation step, the temperature is raised to the desired level to achieve rapid thermal oxidation. Although temperatures would be in the range of 700° C., they are still much lower than those conventionally practiced. Typical conditions are:

Gases = $O_3$ (150–1000 sccm), $O_2$ (900–2000 sccm)
Pressure = 5–760 Torr
tool set = AME 5000, 5500 or single wafer rapid Thermal Reactor
thickness = 20–100Å (3–120 sec.)
RF power = less than 200W (~less than 1W/cm$^2$)
Temperature = 500°–1100° C.

It is apparent that modifications of this invention can be practiced without departing from the essential scope of this invention.

We claim:

1. A semiconductor structure comprising: a substrate, an oxide layer on said substrate, a masked doped polysilicon layer on said oxide layer and a thin oxidized spacer formed by oxygen-ozone plasma oxidation overlying said oxide layer and unmasked portions of said polysilicon layer.

2. A semiconductor structure of claim 1 wherein said thin oxide spacer has a thickness in the range of 30–300Å.

3. A semiconductor structure as in claim 1, wherein said doped polysilicon layer has a nitride mask.

4. A semiconductor capacitor structure comprising: a substrate, an oxide layer grown by ozone plasma oxidation on said substrate, a CVD silicon nitride layer on top of said oxide layer and a thin oxidized oxide layer on top the nitride layer.

5. A semiconductor structure of claim 4 where oxide/nitride/oxide has a composited thickness in the range of 20–150Å.

6. A semiconductor capacitor structure comprising trench structures on a substrate, an oxide layer grown by ozone plasma oxidation on said substrate with trench structures, a CVD silicon nitride layer on top of said oxide layer and a thin oxide layer on top the nitride layer.

7. A semiconductor structure of claim 6 where oxide/nitride/oxide has a composited thickness in the range of 20–150Å.

8. A semiconductor structure comprising a substrate, and a gate oxide having a thickness less than 70Å deposited on said substrate by oxygen-ozone plasma oxidation.

* * * * *